United States Patent
Lee et al.

(10) Patent No.: US 10,186,367 B2
(45) Date of Patent: Jan. 22, 2019

(54) ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Jae Wook Lee, Suwon-Si (KR); Jae Yeol Choi, Suwon-Si (KR); Sung Kwon Oh, Suwon-Si (KR); Min Sung Choi, Suwon-Si (KR); Ji Hea Kim, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 158 days.

(21) Appl. No.: 14/995,084

(22) Filed: Jan. 13, 2016

(65) Prior Publication Data
US 2016/0234979 A1    Aug. 11, 2016

(30) Foreign Application Priority Data

Feb. 11, 2015 (KR) .................. 10-2015-0020810

(51) Int. Cl.
*H01F 27/29* (2006.01)
*H01G 4/012* (2006.01)
(Continued)

(52) U.S. Cl.
CPC ....... *H01F 27/292* (2013.01); *H01F 17/0013* (2013.01); *H01F 17/0033* (2013.01);
(Continued)

(58) Field of Classification Search
CPC  H01G 4/40; H01G 4/232; H01G 4/30; H01G 4/012; H05K 9/0026; H01F 27/292
See application file for complete search history.

(56) References Cited

U.S. PATENT DOCUMENTS

| | | | | |
|---|---|---|---|---|
| 6,903,919 B2* | 6/2005 | Kayatani | ................ | H01G 2/103 29/25.41 |
| 2005/0286205 A1* | 12/2005 | Togashi | ................. | H01G 4/012 361/303 |

(Continued)

FOREIGN PATENT DOCUMENTS

| JP | 63071524 U | * | 5/1988 |
|---|---|---|---|
| JP | 2009021512 A | * | 1/2009 |

(Continued)

OTHER PUBLICATIONS

Notice of Office Action issued in corresponding Korean Patent Application No. 10-2015-0020810, dated Apr. 6, 2016, with English translation.

(Continued)

*Primary Examiner* — David M Sinclair
(74) *Attorney, Agent, or Firm* — McDermott Will & Emery LLP (57) ABSTRACT

An electronic component includes a body having a bottom surface provided as a mounting surface, a top surface opposing the bottom surface, first and second side surfaces opposing each other in a width direction, and third and fourth end surfaces opposing each other in a length direction, a conductor part disposed therein, first and second external electrodes spaced apart from each other on the bottom surface of the body and connected to the conductor part, and a first insulating coating layer on the top surface of the body and a second insulating coating layer on the bottom surface of the body.

17 Claims, 7 Drawing Sheets

(51) Int. Cl.
  *H01G 4/30* (2006.01)
  *H01G 4/232* (2006.01)
  *H05K 1/11* (2006.01)
  *H05K 1/18* (2006.01)
  *H05K 9/00* (2006.01)
  *H01G 4/40* (2006.01)
  *H01G 2/06* (2006.01)
  *H01F 17/00* (2006.01)
  *H01G 4/12* (2006.01)

(52) U.S. Cl.
  CPC ............... *H01G 2/06* (2013.01); *H01G 4/012* (2013.01); *H01G 4/232* (2013.01); *H01G 4/30* (2013.01); *H01G 4/40* (2013.01); *H05K 1/111* (2013.01); *H05K 1/181* (2013.01); *H05K 9/0026* (2013.01); *H01F 2017/0066* (2013.01); *H01G 4/1227* (2013.01); *H05K 2201/1003* (2013.01); *H05K 2201/10015* (2013.01)

(56) References Cited

U.S. PATENT DOCUMENTS

| | | | |
|---|---|---|---|
| 2009/0207554 A1 | 8/2009 | Iguchi et al. | |
| 2010/0189882 A1* | 7/2010 | Hopper | H01C 7/02 427/102 |
| 2010/0206624 A1* | 8/2010 | Feichtinger | H01G 4/228 174/260 |
| 2010/0246143 A1* | 9/2010 | Dinh | H05K 9/0026 361/748 |
| 2012/0223798 A1* | 9/2012 | Wei | H01C 1/028 336/200 |
| 2012/0274432 A1* | 11/2012 | Jeong | H01F 27/2804 336/192 |
| 2013/0050893 A1* | 2/2013 | Kim | H01G 4/228 361/306.3 |
| 2013/0050897 A1* | 2/2013 | Kim | H01G 4/12 361/321.2 |
| 2014/0078643 A1* | 3/2014 | Odahara | H01F 17/0013 361/306.3 |
| 2014/0160615 A1 | 6/2014 | Lee et al. | |
| 2014/0168851 A1 | 6/2014 | Lee et al. | |
| 2014/0268488 A1* | 9/2014 | Hattori | H01G 4/30 361/301.4 |
| 2016/0003737 A1* | 1/2016 | Shimada | H01G 4/30 361/301.4 |

FOREIGN PATENT DOCUMENTS

| | | |
|---|---|---|
| JP | 2009054973 A * | 3/2009 |
| JP | 2011014940 A | 1/2011 |
| JP | 2013-080875 A | 5/2013 |
| JP | 2014-120748 A | 6/2014 |
| KR | 10-2012-0122589 A | 11/2012 |
| KR | 10-2013-0024531 A | 3/2013 |
| KR | 10-2014-0073140 A | 6/2014 |
| TW | 200921712 A | 5/2009 |

OTHER PUBLICATIONS

Korean Notice of Office Action issued in corresponding Korean Patent Application No. 10-2015-0020810, dated Nov. 1, 2016; with English translation.

The First Office Action issued in Chinese Patent Application No. 201510780750.X, dated Jul. 2, 2018; with English translation.

* cited by examiner

ELECTRONIC COMPONENT AND BOARD HAVING THE SAME

CROSS-REFERENCE TO RELATED APPLICATION

This application claims the priority and benefit of Korean Patent Application No. 10-2015-0020810 filed on Feb. 11, 2015, with the Korean Intellectual Property Office, the disclosure of which is incorporated herein by reference.

BACKGROUND

The present disclosure relates to an electronic component and a board having the same.

Among electronic components, inductors and capacitors are representative passive elements configuring an electronic circuit to remove noise therefrom.

Such an inductor is manufactured by forming a magnetic body including a coil therein, and subsequently, forming external electrodes on outer surfaces of the magnetic body.

In addition, the capacitor, an electronic component, may be manufactured by forming a capacitor body including a dielectric material and internal electrodes, and then, forming external electrodes on outer surfaces of the capacitor body.

SUMMARY

An aspect of the present disclosure may provide an electronic component in which the occurrence of short circuits is decreased by suppressing plating solution spreading, and a board having the same.

According to an aspect of the present disclosure, an electronic component may include a body having a bottom surface provided as a mounting surface and a top surface opposing the bottom surface, first and second external electrodes disposed to be spaced apart from each other on the bottom surface of the body, and insulating coating layers disposed on the top and bottom surfaces of the body, such that plating solution spreading may be suppressed in the electronic component.

According to another aspect of the present disclosure, a board having an electronic component may include a printed circuit board on which first and second electrode pads are formed, and the electronic component as described above, mounted on the printed circuit board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

Electronic Component

Figure 1:
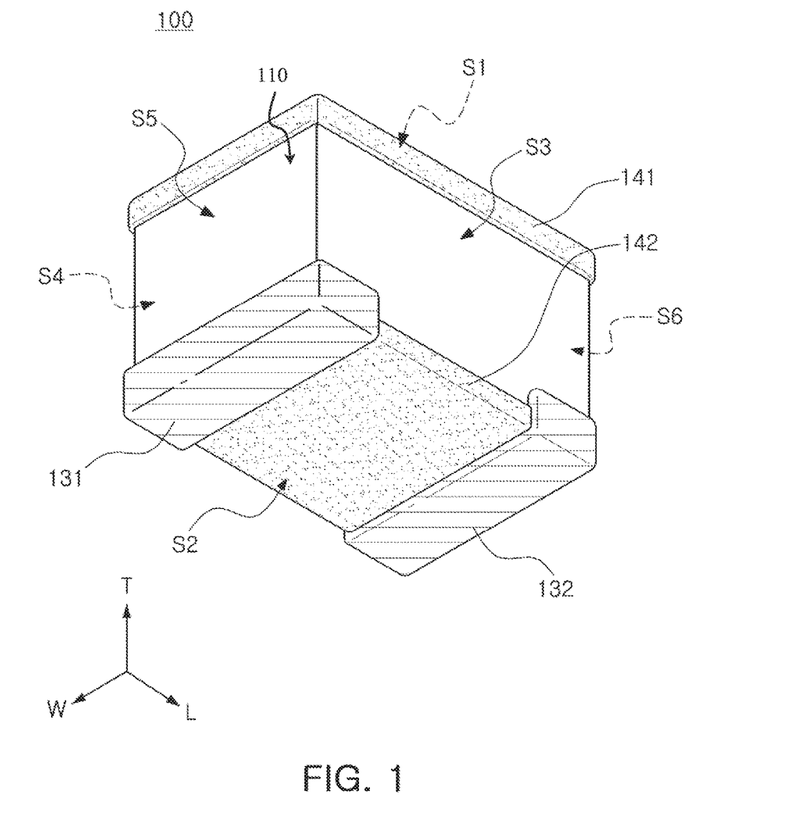
FIG. 1 is a perspective view schematically illustrating an electronic component according to an exemplary embodiment in the present disclosure.

FIG. 1 is a perspective view schematically illustrating an electronic component according to an exemplary embodiment in the present disclosure.

Referring to FIG. 1, the electronic component 100 according to the exemplary embodiment in the present disclosure may include a body 110, external electrodes 131 and 132, and insulating coating layers 141 and 142.

The body 110 may include dielectric layers or magnetic layers, and include a conductor part therein.

The body 110 is not particularly limited, but may have, for example, a hexahedral shape.

Meanwhile, in the exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction perpendicular to amounting surface of the electronic component.

In the exemplary embodiment in the present disclosure, the body 110 may have top and bottom surfaces S1 and S2 opposing each other in the thickness direction, first and second side surfaces S3 and S4 opposing each other in the width direction, and third and fourth end surfaces S5 and S6 opposing each other in the length direction.

Figure 2:
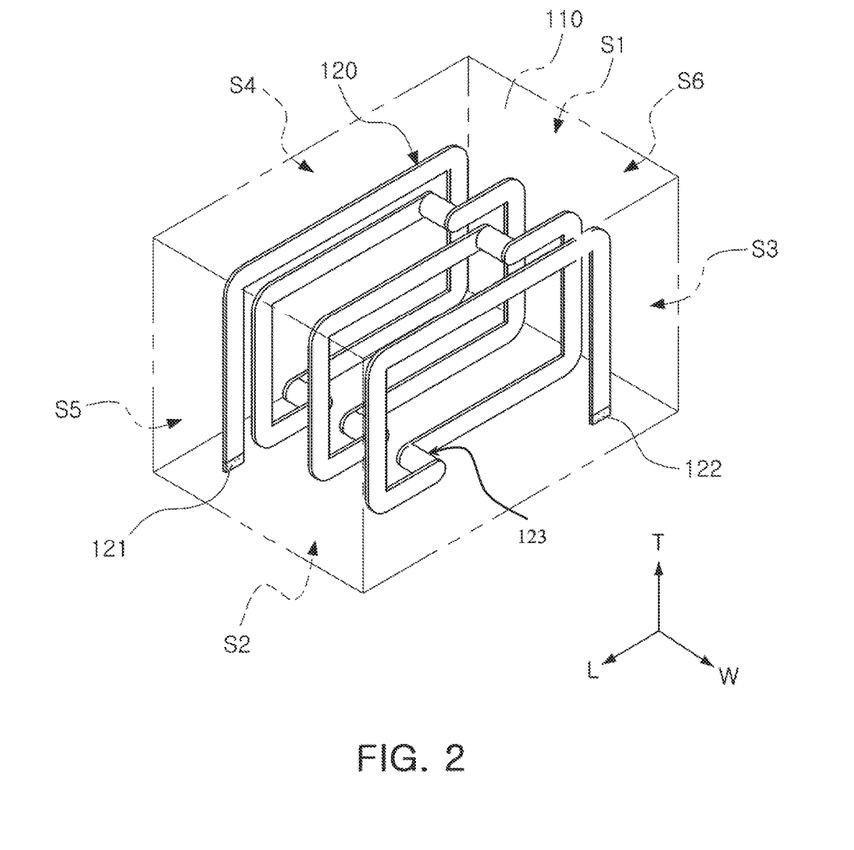
FIG. 2 is a perspective view schematically illustrating a body according to the exemplary embodiment in the present disclosure.
Figure 3:
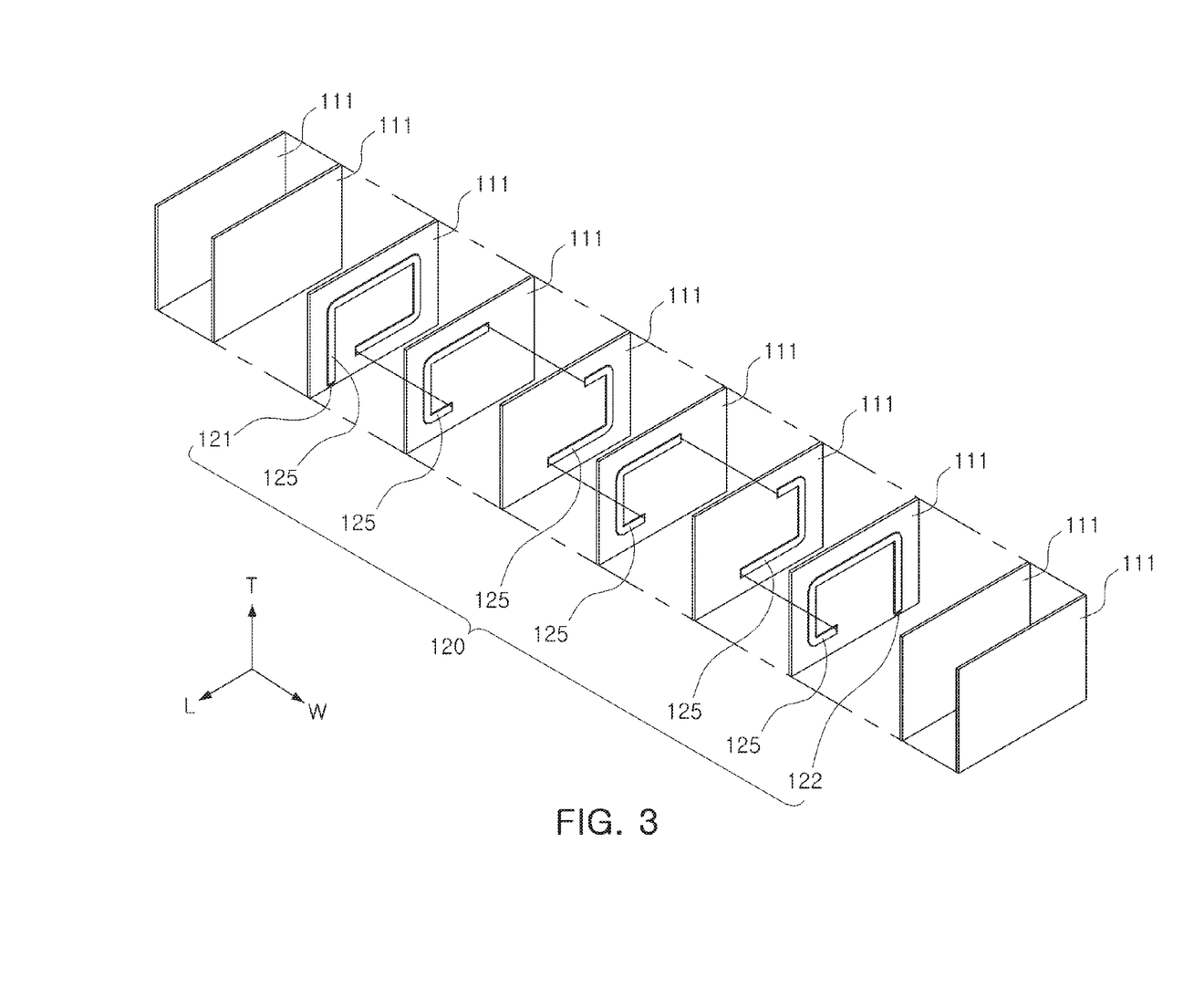
FIG. 3 is an exploded perspective view of FIG. 2.

FIG. 2 is a perspective view schematically illustrating the body according to the exemplary embodiment in the present disclosure, and FIG. 3 is an exploded perspective view of FIG. 2.

According to the exemplary embodiment in the present disclosure, the body 110 may be an inductor body including a coil 120 having a coil shape formed therein, as illustrated in FIG. 2.

According to the exemplary embodiment in the present disclosure, a conductor part disposed in the body may be the coil 120.

The inductor body 110 is formed by stacking a plurality of magnetic layers 111, wherein the plurality of magnetic layers 111 forming the inductor body 110 may be in a sintered state, and adjacent magnetic layers may be integrated so that boundaries therebetween are not readily apparent without the use of a scanning electron microscope (SEM).

The inductor body 110 may contain an $Al_2O_3$-based dielectric material or ferrite known in the art such as Mn—Zn-based ferrite, Ni—Zn-based ferrite, Ni—Zn—Cu-based ferrite, Mn—Mg-based ferrite, Ba-based ferrite, Li-based ferrite, or the like.

The coil 120 may be formed by an electrical connection of a coil pattern 125 formed by printing a conductive paste containing a conductive metal on the plurality of magnetic layers 111 forming the inductor body 110 to a predetermined thickness.

Vias 123 may be formed in predetermined positions in respective magnetic layers 111 on which the coil pattern 125 is printed, and the coil patterns 125 formed on the respective magnetic layers 111 may be connected to each other by the vias 123 to thereby form a single coil 120.

The conductive metal forming the coil pattern 125 is not particularly limited as long as it has sufficient electrical conductivity. For example, silver (Ag), palladium (Pd), aluminum (Al), nickel (Ni), titanium (Ti), gold (Au), copper (Cu), platinum (Pt), or the like, or alloys thereof, may be used as the conductive metal.

In this case, as the plurality of magnetic layers 111 on which the coil pattern 125 is formed are stacked in the width direction (W) or length direction (L), the coil 120 may be formed in a direction perpendicular to a substrate mounting surface of the inductor body 110.

First and second lead portions 121 and 122 of the coil 120 may be exposed to the same surface of the inductor body 110 as each other. For example, the first and second lead portions 121 and 122 maybe exposed to a bottom surface S2 of the inductor body 110 in the thickness (T) direction.

Figure 4:
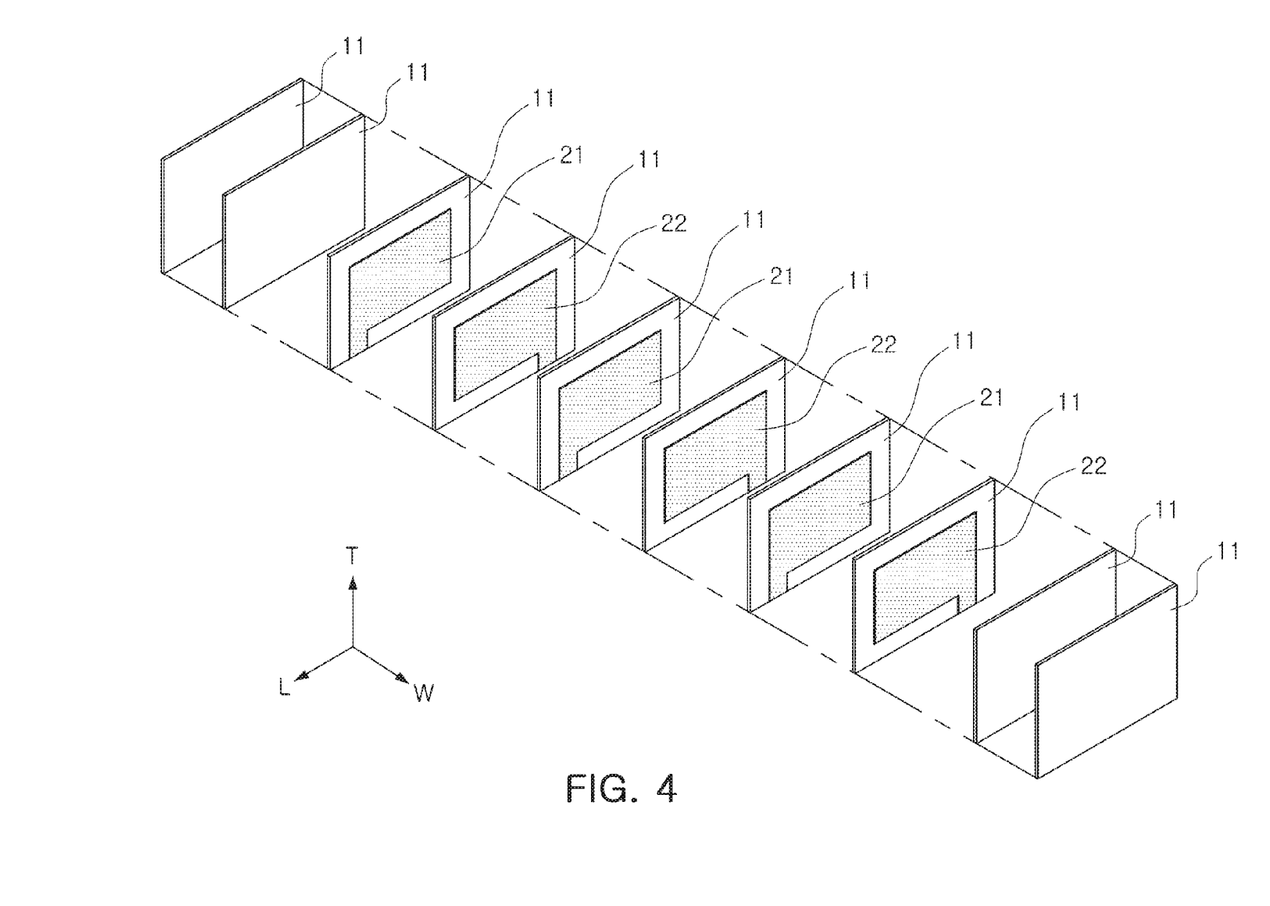
FIG. 4 is an exploded perspective view schematically illustrating a body according to another exemplary embodiment in the present disclosure.

FIG. 4 is an exploded perspective view schematically illustrating a body according to another exemplary embodiment in the present disclosure.

According to another exemplary embodiment, the body may be a capacitor body including a plurality of dielectric layers 11 and first and second internal electrodes 21 and 22 disposed on the dielectric layers and overlapping each other to form capacitance, as illustrated in FIG. 1.

According to another exemplary embodiment, a conductor part disposed in the body may include the first and second internal electrodes 21 and 22.

The capacitor body 110 is formed by stacking the plurality of dielectric layers 11, wherein the plurality of dielectric layers 11 forming the capacitor body 110 may be in a sintered state, and adjacent dielectric layers may be integrated so that boundaries therebetween are not readily apparent without the use of a scanning electron microscope (SEM).

The dielectric layer 11 may contain a ceramic powder having high permittivity, for example, a barium titanate ($BaTiO_3$)-based powder or a strontium titanate ($SrTiO_3$)-based powder, or the like. However, a material of the dielectric layer 11 is not limited thereto.

According to another exemplary embodiment in the present disclosure, the first and second internal electrodes 21 and 22, a pair of electrodes to which voltages having opposing polarities are applied, may be formed by printing a conductive paste containing a conductive metal on the dielectric layers 11 to a predetermined thickness and electrically insulated from each other by the dielectric layer 11 disposed therebetween.

Further, the conductive metal contained in the first and second internal electrodes 21 and 22 may be nickel (Ni), copper (Cu), palladium (Pd), or alloys thereof, but the conductive metal is not limited thereto.

According to another exemplary embodiment in the present disclosure, the first and second internal electrodes may be exposed to the same surface of the capacitor body as each other. For example, end portions of the first and second internal electrodes 21 and 22 may be exposed to a bottom surface S2 of the capacitor body 110 in the thickness (T) direction.

Although a multilayer inductor body and a multilayer capacitor body are disclosed in the present disclosure as examples of the body, the body may be variously changed, and bodies of various passive elements may be used as the body.

According to the exemplary embodiment in the present disclosure, the external electrodes 131 and 132 may be connected to the conductor part, and disposed on the bottom surface S2 of the body 110.

The external electrode may include first and second external electrodes 131 and 132, and the first and second external electrodes 131 and 132 may be spaced apart from each other.

For example, in a case in which the body is the inductor body, the first external electrode 131 may be connected to the first lead portion 121 of the coil 120, and the second external electrode 132 may be connected to the second lead portion 122 of the coil 120.

Alternatively, in a case in which the body is the capacitor body, the first external electrode 131 may be connected to the first internal electrode 21, and the second external electrode 132 may be connected to the second internal electrode 22.

According to the exemplary embodiment, the first and second external electrodes 131 and 132 may include base electrode layers and plating layers disposed on the base electrode layers.

The base electrode layers may contain a conductive metal, wherein the conductive metal may be nickel (Ni), copper (Cu), palladium (Pd), gold (Au), or alloys thereof. However, the conductive metal is not limited thereto.

The base electrode layers may be sintering-type electrodes formed by sintering a paste containing the conductive metal.

Preferably, the base electrode layers may be formed by sintering a paste containing glass and copper as the conductive metal.

The plating layers maybe disposed on the base electrode layers and include nickel (Ni) plating layers and tin (Sn) plating layers disposed on the nickel plating layers.

As in the exemplary embodiment in the present disclosure, the first and second external electrodes 131 and 132 are disposed on the bottom surface of the body, such that at the time of mounting the electronic component on a board, mounting density may be increased.

Referring back to FIG. 1, according to the exemplary embodiment in the present disclosure, a first insulating coating layer 141 may be disposed on the top surface S1 of the body, and a second insulating coating layer 142 may be disposed on the bottom surface S2 of the body.

The insulating coating layers 141 and 142 may be formed by applying a material such as silicone, epoxy, or the like, or by coating glass.

The first and second insulating coating layers 141 and 142 may be disposed before the plating layers are formed on the base electrode layers.

In a case of forming plating layers on base electrode layers of first and second external electrodes, plating solution spreading may be generated along a surface of a body.

However, the insulating coating layers are disposed in the top and bottom surfaces of the body as in the exemplary embodiment in the present disclosure, whereby occurrence of the plating solution spreading in the top and bottom surfaces of the body may be prevented.

Particularly, in a case in which the body is an inductor body including the conductor such as a metal, or the like, at the time of forming the plating layers, the plating solution spreading may significantly occur in the top and bottom surfaces of the body.

In a case in which the plating solution spreading occurs in the top surface of the body, a short-circuit may occur due to conductivity between a metal case covering the electronic component after mounting the electronic component and the external electrodes, and in a case in which the plating solution spreading occurs in the bottom surface of the body, short-circuits may occur due to conduction between the first and second external electrodes, thereby causing malfunctioning of the electronic component.

In order to suppress the plating solution spreading, there is a need to limit a plating thickness of the external electrode. In this case, adhesive strength of the external electrodes may be decreased, and a soldering defect may occur.

However, in a case of forming the insulating coating layers on the top and bottom surfaces of the body as in the exemplary embodiment in the present disclosure, occurrence of the plating solution spreading in the top and bottom surfaces of the body may be prevented, and a thickness of the plating layers of the external electrodes may be increased.

Therefore, a short-circuit with the metal case or a short-circuit between the external electrodes may be prevented, and at the time of mounting the electronic component on a board, adhesive strength of the external electrodes and solderability may be improved.

The first external electrode 131 may extend from the bottom surface of the body to the first and second side surfaces and the third end surface thereof, and the second external electrode 132 may extend from the bottom surface of the body to the first and second side surfaces and the fourth end surface thereof.

The first and second external electrodes extend to the side surfaces and end surfaces of the body, adhesive strength and mounting stability of the external electrodes thereby being improved.

Figure 5:
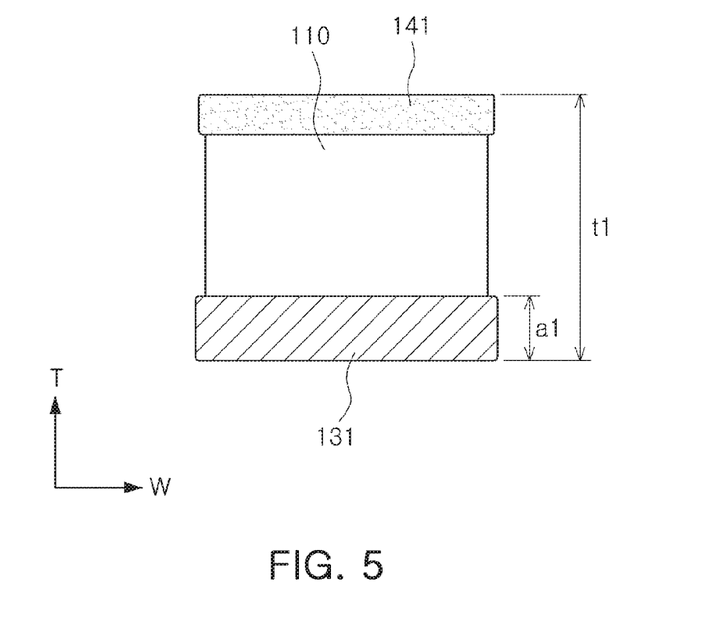
FIG. 5 is a view of surface S5 of the electronic component according to the present disclosure.

FIG. 5 is a view of the surface S5 of the electronic component according to the present disclosure.

Referring to FIG. 5, when a thickness of the electronic component is defined as t1, and a width of extended portions of the first and second external electrodes 131 and 132 on the first or second side surface or the third or fourth end surface of the body is defined as a1, a1/t1 may satisfy $0.1 \leq a1/t1 \leq 1$, but is not limited thereto.

In a case in which the width a1 of the extended portions of the first and second external electrodes 131 and 132 is equal to or greater than 10% of the thickness t1 of the electronic component, adhesive strength of the external electrodes may be improved.

The first insulating coating layer 141 may extend from the top surface of the body to the first and second side surfaces S3 and S4 of the body and the third and fourth end surfaces S5 and S6 thereof, and the second insulating coating layer 142 may extend from the bottom surface of the body to the first and second side surfaces S3 and S4 of the body. The first and second insulating coating layers partially extend to side surfaces of the body, such that the plating solution spreading may be more efficiently suppressed.

Figure 6:
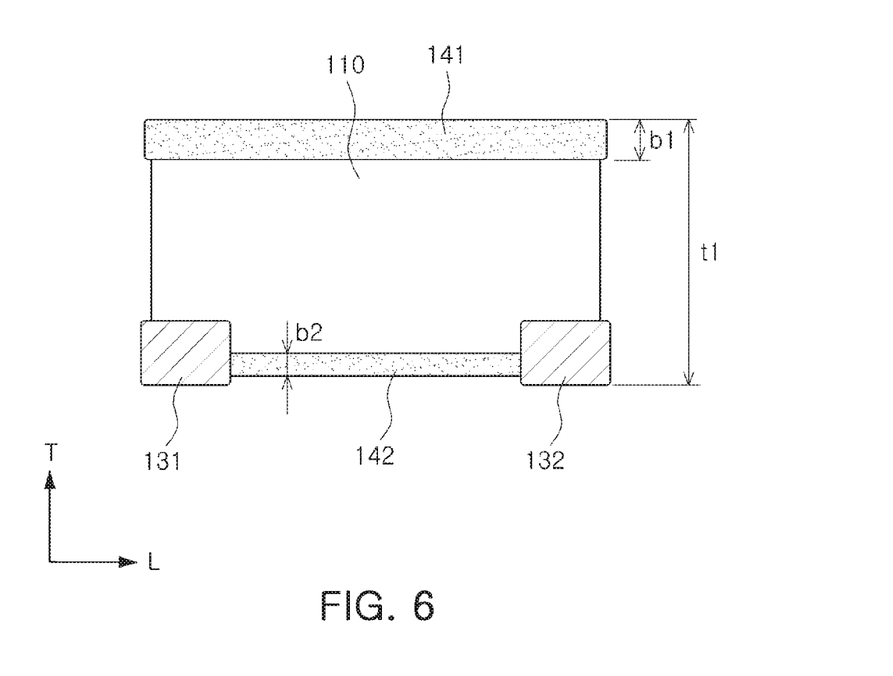
FIG. 6 is a view of surface S3 of the electronic component according to the present disclosure.

FIG. 6 is a view of the surface S3 of the electronic component according to the present disclosure.

Referring to FIG. 6, when the thickness of the electronic component is defined as t1, and a width of an extended portion of the first insulating coating layer 141 on the first or second side surface or the third or fourth end surface of the body is defined as b1, b1/t1 may satisfy $0.1 \leq b1/t1 \leq 1$, but is not limited thereto.

Alternatively, when the thickness of the electronic component is defined as t1, and a width of an extended portion of the second insulating coating layer 142 on the first or second side surface of the body is defined as b2, b2/t1 may satisfy $0.1 \leq b2/t1 \leq 1$.

In a case in which $0.1 \leq b1/t1$ or $0.1 \leq b2/t1$ is satisfied, the plating solution spreading may be efficiently suppressed.

In addition, a ratio of an area of the first insulating coating layer 141 covering the top surface of the body to an area of the top surface of the body may be 0.1 to 1, but is not limited thereto. In a case in which the ratio of the area of the first insulating coating layer 141 covering the top surface of the body to the area of the top surface of the body is less than 0.1, an effect of suppressing the plating solution spreading may be insufficient.

Further, a ratio of an area of the second insulating coating layer 142 covering the bottom surface of the body to an area of a portion of the top surface of the body on which the external electrodes are not formed may be 0.1 to 1. In a case in which the ratio of the area of the second insulating coating layer 142 covering the bottom surface of the body to the area of the portion of the bottom surface of the body on which the external electrodes are not formed is less than 0.1, the effect of suppressing the plating solution spreading may be insufficient.

Board Having Electronic Component

Figure 7:
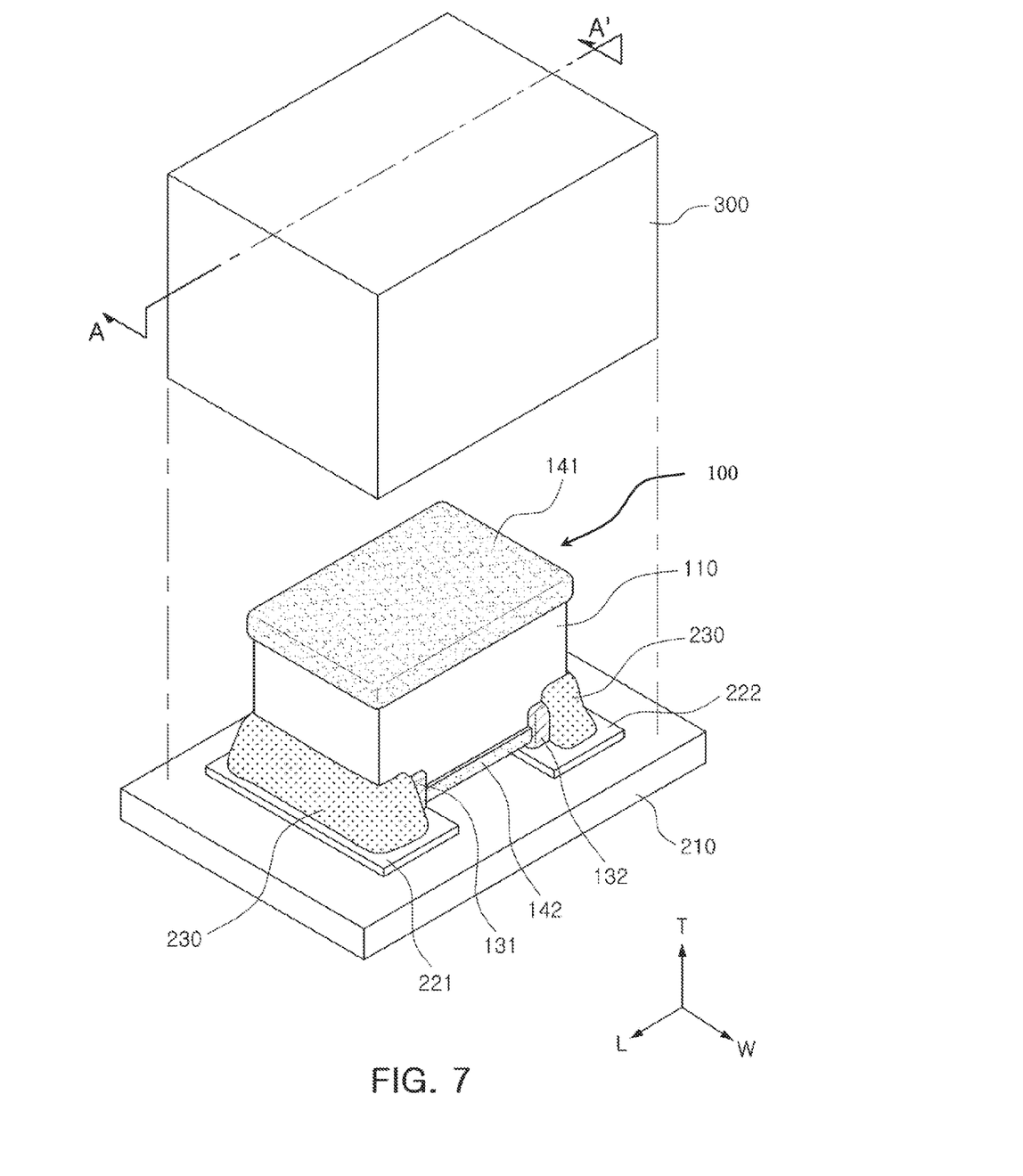
FIG. 7 is a perspective view schematically illustrating a board having an electronic component according to another exemplary embodiment in the present disclosure.
Figure 8:
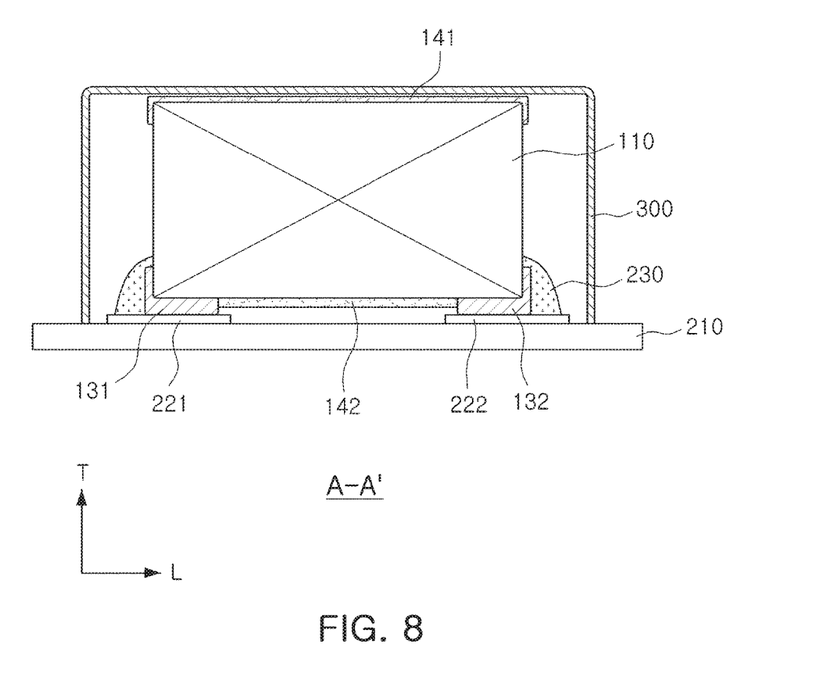
FIG. 8 is a cross-sectional view taken along line A-A' of FIG. 7.

FIG. 7 is a schematic perspective view illustrating board having an electronic component according to another exemplary embodiment in the present disclosure, and FIG. 8 is a cross-sectional view taken along line A-A' of FIG. 7.

Referring to FIGS. 7 and 8, the board having an electronic component according to the present exemplary embodiment may include a printed circuit board 210 on which first and second electrode pads 221 and 222 are formed and an electronic component 100 installed on the printed circuit board 210.

In this case, the electronic component 100 may be electrically connected to the printed circuit board 210 by solders 230 in a state in which first and second external electrodes 131 and 132 are positioned to contact the first and second electrode pads 221 and 222, respectively.

The board having an electronic component according to another exemplary embodiment may further include a metal case 300 covering the electronic component.

The metal case 300 may suppress mutual noise interference between electronic components in an electronic component set.

The metal case 300, having a shape in which one surface is open, may have an internal accommodation space and may be disposed so that the open surface faces the printed circuit board 210 and the metal case 300 accommodates the electronic component 100 in the internal accommodation space.

A description of the same contents of the board having an electronic component as those of the above-mentioned electronic component will be omitted in order to avoid an overlapping description.

As set forth above, according to exemplary embodiments in the present disclosure, the plating solution spreading may be suppressed, such that the electronic component of which malfunction due to occurrence of the short-circuit is decreased and adhesive strength of the external electrode and solderability are improved, and the board having the same may be provided.

While exemplary embodiments have been shown and described above, it will be apparent to those skilled in the art that modifications and variations could be made without departing from the scope of the present invention as defined by the appended claims.

What is claimed is:

1. An electronic component comprising:
    a body having a bottom surface provided as a mounting surface and a top surface opposing the bottom surface in a thickness direction, first and second side surfaces opposing each other in a width direction, and third and fourth end surfaces opposing each other in a length direction, and including a conductor part disposed in the body;
    first and second external electrodes spaced apart from the top surface, disposed at least on the bottom surface, and connected to the conductor part;
    a first insulating coating layer on the top surface of the body and extending on at least one of the first side surface or the second side surface and on at least one of the third end surface or the fourth end surface of the body; and
    a second insulating coating layer on the bottom surface of the body,
    wherein the first and second external electrodes are spaced apart from a material for forming the first insulating coating layer, and
    $b1/t1$ satisfies $0.1 \leq b1/t1 \leq 1$, in which $t1$ is a thickness of the electronic component in the thickness direction, and $b1$ is a distance of an extending portion of the first insulating coating layer extending, along the thickness direction, on the at least one of the first side surface or the second side surface and on the at least one of the third end surface or the fourth end surface of the body.

2. The electronic component of claim 1, wherein the second insulating coating layer is disposed between the first and second external electrodes.

3. The electronic component of claim 1, wherein the first and second external electrodes extend from the bottom surface of the body to the first and second side surfaces of the body.

4. The electronic component of claim 1, wherein the first external electrode extends from the bottom surface of the body to the third end surface of the body, and the second external electrode extend from the bottom surface of the body to the fourth end surface of the body.

5. The electronic component of claim 4, wherein $a1/t1$ satisfies $0.1 \leq a1/t1 \leq 1$, in which $a1$ is a distance of an extending portion of each of the first and second external electrodes extending, along the thickness direction, on the first or second side surface or on the third or fourth end surface of the body.

6. The electronic component of claim 1, wherein the first and second external electrodes comprise plating layers.

7. The electronic component of claim 1, wherein the conductor part comprises a coil having a coil shape.

8. The electronic component of claim 7, wherein the coil is formed in a direction perpendicular to the bottom surface of the body and includes first and second lead portions exposed to the bottom surface of the body.

9. The electronic component of claim 1, wherein the conductor part comprises first and second internal electrodes overlapping each other to form capacitance.

10. The electronic component of claim 1, wherein the second insulating coating layer extends from the bottom surface of the body to the first and second side surfaces of the body.

11. The electronic component of claim 1, wherein a ratio of an area of the first insulating coating layer covering the top surface of the body to an area of the top surface of the body is 0.1 to 1.

12. The electronic component of claim 1, wherein a ratio of an area of the second insulating coating layer covering the bottom surface of the body to an area of a portion of the top surface of the body on which the external electrodes are not formed is 0.1 to 1.

13. A board having an electronic component, the board comprising:
    a printed circuit board on which first and second electrode pads are provided;
    an electronic component mounted on the printed circuit board and including a body having a bottom surface provided as a mounting surface and a top surface opposing the bottom surface opposing each other in a thickness direction, first and second side surfaces opposing each other in a width direction, and third and fourth end surfaces opposing each other in a length direction and including a conductor part disposed in the body, first and second external electrodes spaced apart from the top surface, spaced apart from each other on the bottom surface of the body, and connected to the conductor part, a first insulating coating layer on the top surface of the body and extending on at least one of the first side surface or the second side surface and on at least one of the third end surface or the fourth end surface of the body, and a second insulating coating layer on the bottom surface of the body, wherein the first and second external electrodes are spaced apart from a material for forming the first insulating coating layer, and $b1/t1$ satisfies $0.1 \leq b1/t1 \leq 1$, in which $t1$ is a thickness of the electronic component in the thickness direction, and $b1$ is a distance of an extending portion of the first insulating coating layer extending, along the thickness direction, on the at least one of the first side surface or the second side surface and on the at least one of the third end surface or the fourth end surface of the body; and
    solders connecting the first and second external electrodes to the first and second electrode pads.

14. The board of claim 13, further comprising a metal case disposed on the printed circuit board to cover the electronic component.

15. The board of claim 13, wherein the second insulating coating layer is disposed between the first and second external electrodes.

16. The board of claim 13, wherein the first and second external electrodes comprise plating layers.

17. The board of claim 13, wherein the conductor part comprises a coil having a coil shape, and
    the coil is formed in a direction perpendicular to the bottom surface of the body and includes first and second lead portions exposed to the bottom surface of the body.

* * * * *